(12) United States Patent
Chou et al.

(10) Patent No.: US 6,957,312 B1
(45) Date of Patent: Oct. 18, 2005

(54) NVRAM CONTROL PROTOCOL

(75) Inventors: Norman C. Chou, San Jose, CA (US);
Prasad Vajjhala, San Jose, CA (US);
Daniel Bourke, San Francisco, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 357 days.

(21) Appl. No.: 10/431,995

(22) Filed: May 7, 2003

(51) Int. Cl.$^7$ .............................................. G06F 12/16
(52) U.S. Cl. ...................... 711/163; 711/103
(58) Field of Search ................................. 711/103, 163

(56) References Cited

U.S. PATENT DOCUMENTS 5,195,100 A * 3/1993 Katz et al. .................... 714/22
2003/0099134 A1 * 5/2003 Lasser et al. .......... 365/185.29
2003/0221049 A1 * 11/2003 Oguri et al. ................. 711/104
2004/0068548 A1 * 4/2004 Sugita ........................ 709/208

* cited by examiner

Primary Examiner—Kevin L. Ellis

(57) ABSTRACT

In one embodiment, a method for facilitating detection of, and recovery from, data contamination in a non-volatile storage device coupled to an interconnect device includes receiving data to be written to a content area on a non-volatile storage device coupled to an interconnect device, updating a contamination indicator stored in a supplemental area of the non-volatile storage device with a first value indicating potential data contamination in the content area, and transferring the data to the non-volatile storage device for a write to the content area. Further, if a determination is made that the write of the transferred data has completed, the contamination indicator is updated with a second value indicating lack of data contamination in the content area.

39 Claims, 7 Drawing Sheets

NVRAM CONTROL PROTOCOL

FIELD OF THE INVENTION

The present invention relates generally to the field of data communications and, more specifically, to facilitating detection of, and recovery from, data contamination in a non-volatile storage device coupled to an interconnect device.

BACKGROUND OF THE INVENTION

Existing networking and interconnect technologies have failed to keep pace with the development of computer systems, resulting in increased burdens being imposed upon data servers, application processing and enterprise computing. A number of computing technologies implemented to meet computing demands (e.g., clustering, fail-safe and 24×7 availability) require increased capacity to move data between processing nodes (e.g., servers), as well as within a processing node between, for example, a Central Processing Unit (CPU) and Input/Output (I/O) devices.

With a view to meeting the above described challenges, a new interconnect technology, called the InfiniBand™, has been proposed for interconnecting processing nodes and I/O nodes to form a System Area Network (SAN). This architecture has been designed to be independent of a host Operating System (OS) and processor platform. The InfiniBand™ Architecture (IBA) is centered around a point-to-point, switched IP fabric whereby end node devices (e.g., inexpensive I/O devices such as a single chip SCSI or Ethernet adapter, or a complex computer system) may be interconnected utilizing a cascade of switch devices. The InfiniBand™ Architecture is defined in the InfiniBand™ Architecture Specification Volume 1, Releases 1.0, 1.0a and 1.1, released Oct. 24, 2000, Jun. 19, 2001 and Nov. 6, 2002 respectively by the InfiniBand Trade Association. The IBA supports a range of applications ranging from back plane interconnect of a single host, to complex system area networks, as illustrated in FIG. 1 (prior art). In a single host environment, each IBA switched fabric may serve as a private I/O interconnect for the host providing connectivity between a CPU and a number of I/O modules. When deployed to support a complex system area network, multiple IBA switch fabrics may be utilized to interconnect numerous hosts and various I/O units.

Within a switch fabric supporting a System Area Network, such as that shown in FIG. 1, there may be a number of devices having multiple input and output ports through which data (e.g., packets) is directed from a source device to a destination device. Such devices include, for example, switches, routers, repeaters and adapters (exemplary interconnect devices). In addition to multiple communication ports directing external data packets, an interconnect device such as a switch typically includes a management port. Each sub-network (subnet) is managed by at least one Subnet Manager. A Subnet Manager resides either on an endnode or on an interconnect device and can be implemented either in hardware or software. The Subnet Manager performs its managing functions by communicating with the management port using InfiniBand™ Subnet Management Packets.

The ports of an interconnect device will not function properly until they are loaded with correct configuration information. For example, each communication port must include configuration information identifying port links and other network traffic related parameters. A management port must store, for example, security data such as a management key, a global unique identifier (GUID) of the interconnect device, a GUID of the management port, a local identifier (LID) of the interconnect device, etc.

SUMMARY OF THE INVENTION

Methods and systems for facilitating detection of, and recovery from, data contamination in a non-volatile storage device coupled to an interconnect device are described. According to one aspect of the present invention, an exemplary method includes receiving data to be written to a content area on a non-volatile storage device coupled to an interconnect device, updating a contamination indicator stored in a supplemental area of the non-volatile storage device with a first value indicating potential data contamination in the content area, and transferring the data to the non-volatile storage device for a write to the content area. Further, if a determination is made that the write of the transferred data has completed, the contamination indicator is updated with a second value indicating lack of data contamination in the content area.

Other features of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Methods and systems to facilitate detection of, and recovery from, data contamination in a non-volatile storage device coupled to an interconnect device are described. In the following description, for purposes of explanation, numerous specific details are set forth in order to provide a thorough understanding of the present invention. It will be evident, however, to one skilled in the art that the present invention may be practiced without these specific details.

Note also that embodiments of the present description may be implemented not only within a physical circuit (e.g., on semiconductor chip) but also within machine-readable media. For example, the circuits and designs discussed above may be stored upon and/or embedded within machine-readable media associated with a design tool used for designing semiconductor devices. Examples include a netlist formatted in the VHSIC Hardware Description Language (VHDL) language, Verilog language or SPICE language. Some netlist examples include: a behavioral level netlist, a register transfer level (RTL) netlist, a gate level netlist and a transistor level netlist. Machine-readable media also include media having layout information such as a GDS-II file. Furthermore, netlist files or other machine-readable media for semiconductor chip design may be used in a simulation environment to perform the methods of the teachings described above.

Thus, it is also to be understood that embodiments of this invention may be used as or to support a software program executed upon some form of processing core (such as the CPU of a computer) or otherwise implemented or realized upon or within a machine-readable medium. A machine-readable medium includes any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

For the purposes of the present invention, the term "interconnect device" shall be taken to include switches, routers, repeaters, adapters, or any other device that provides interconnect functionality between nodes. Such interconnect functionality may be, for example, module-to-module or chassis-to-chassis interconnect functionality. While an exemplary embodiment of the present invention is described below as being implemented within a switch deployed within an InfiniBand architectured system, the teachings of the present invention may be applied to any device having an associated memory.

Figure 1:
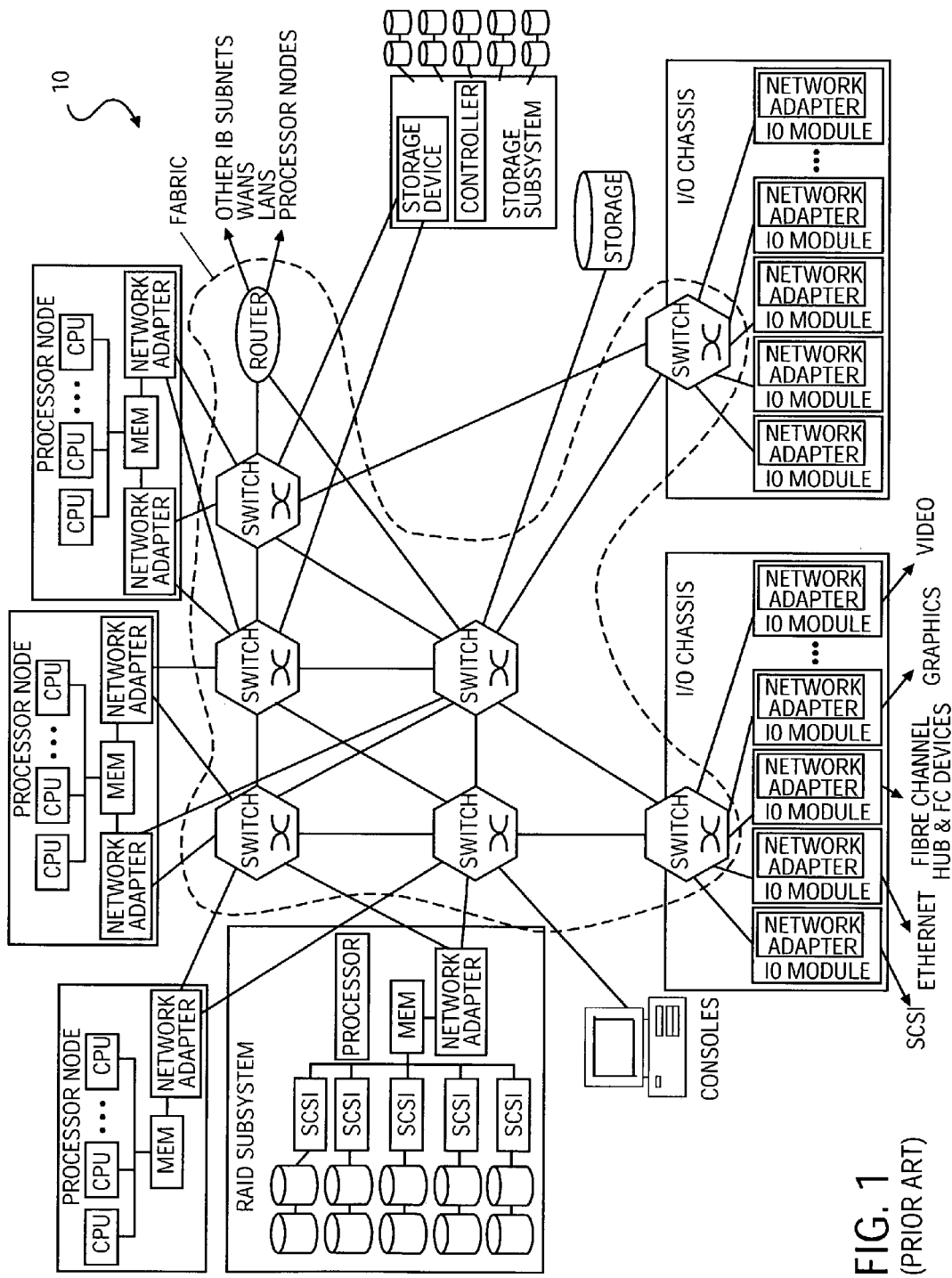
FIG. 1 is a diagrammatic representation of a System Area Network, according to the prior art, as supported by a switch fabric.
Figure 2:
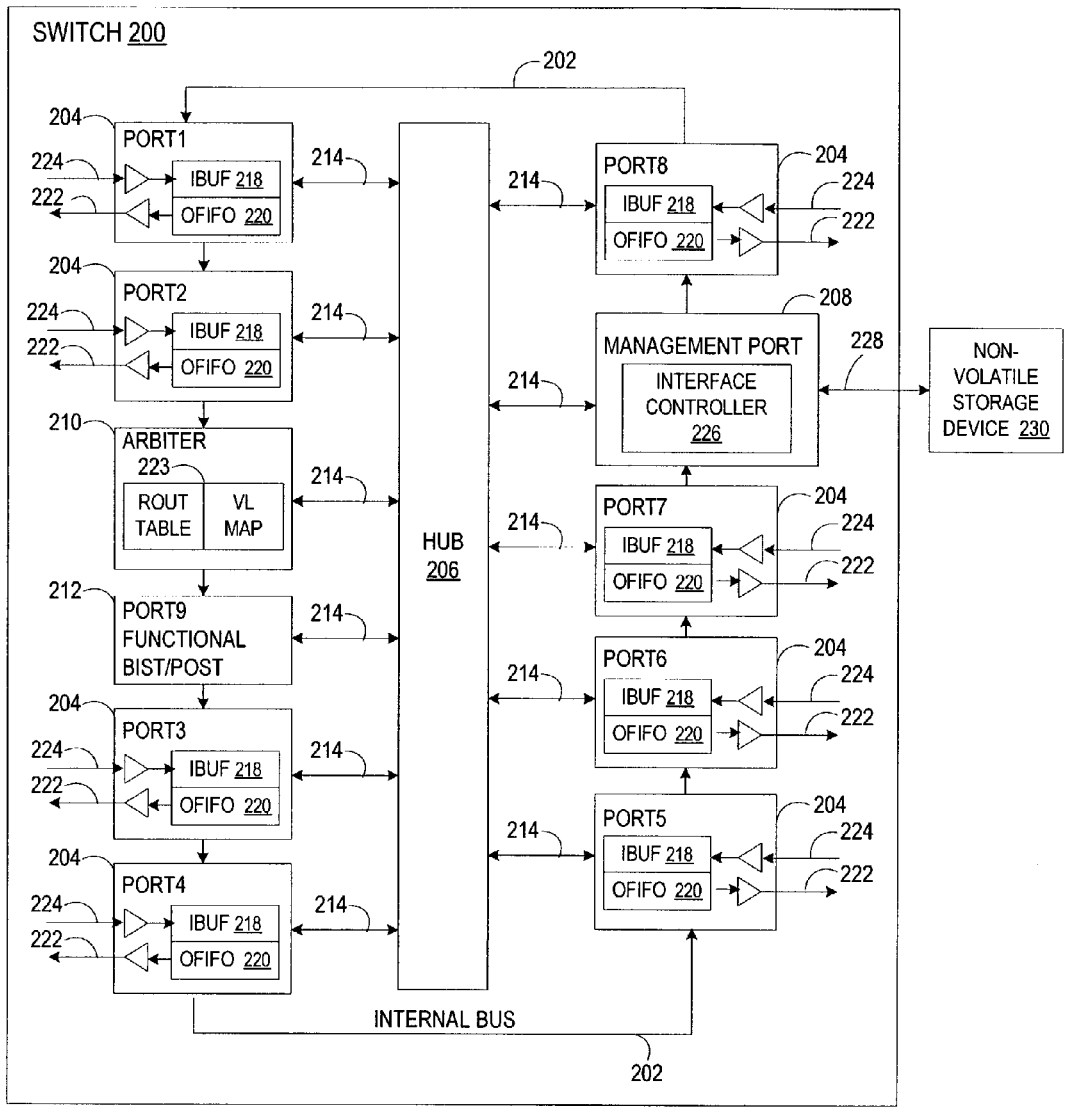
FIG. 2 is a block diagram of one embodiment of an interconnect device.

FIG. 2 is a block diagram of one embodiment of an interconnect device such as a switch 200. The switch 200 includes eight communications ports 204. Each communications port 204 receives incoming data packets via a link 224 and transmits outgoing data packets via a link 222. Incoming data packets are stored in input buffers 218. The capacity of each input buffer 218 is divided equally among data virtual lanes (VLs). Virtual lanes are, in one embodiment, independent data streams that are supported by a common physical link. Further details regarding the concept of "virtual lanes" is provided in the InfiniBand™ Architecture Specification, Version 1.0, Oct. 24, 2000. Outgoing data packets are stored in output buffers 220. Each communications port 204 will not function properly until it is loaded with configuration data such as, for example, parameters pertaining to port links, virtual lane parameters, etc.

As data packets are received at communications ports 204, they compete for input and output resources of the switch 200. An arbiter 210 arbitrates between competing requests for switch resources. These requests are transferred via communications means 214 connected by a hub 206. In one embodiment, each communications means 214 includes ten 36-bit data buses, a 66-bit request bus and a 64-bit grant bus. Communications ports 204 issue resource requests to the arbiter 210 via the request bus and receive resource grants from the arbiter 210 via the grant bus. The arbiter 210 includes a set of tables 222 such as a Linear Forwarding Table to translate a destination address in a data packet to an output port number, a Multicast Forwarding Table to translate a destination address to multiple port numbers, a service level (SL) to VL Mapping Table to map between virtual lanes of communications ports 204, etc. The arbiter 210 is not functional unless these tables and other configuration information are loaded during the initialization process.

In addition to the eight communication ports, a functional Built-In-Self-Test (BIST) port 212 and a management port 208 are also coupled to hub 206. The functional BIST port 212 supports stand-alone, at-speed testing of switch 200. The functional BIST port 212 includes a random packet generator, a directed packet buffer and a return packet checker. As part of the initialization process, the functional BIST port 212 will be loaded with Power-On-Self Test (POST) test controls. After the POST completes, the test results are checked to verify whether the POST has passed or failed. The fail or pass result is posted by an LED and stored in an internal status register.

A management port 208 includes a Performance Management Agent (PMA) that maintains error and performance counters, a Baseboard Management Agent (BMA) that monitors environmental controls and status, and a Subnet Management Agent (SMA) that is responsible for processing subnet management packets (SMP) sent by a subnet manager (SM). The SMPs sent by the subnet manager participate in privileged operations such as initialization and configuration of the switch 200. Accordingly, an authorization mechanism is provided to prevent unauthorized entities from performing such operations. The authorization mechanism may be supported by the subnet manager who maintains current authentication data for the switch 200. Authentication data includes security information such as a management key, a global unique identifier (GUID) of the switch, a GUID of the port, a local identifier (LID) of the switch, etc. In one embodiment, the subnet manager also maintains a previous version of the authentication data to cover a situation in which a backup subnet manager needs to gain control over the interconnect device because of the subnet manager's failure that occurred before it could share the current authentication data with the backup subnet manager.

When creating a data packet with a request to perform a managing operation, the subnet manager includes the current authentication data into the data packet. The SMA receives the data packet from the subnet manager and compares the authentication data included in the data packet with the authentication data stored locally to determine whether the data packet was sent by an authorized entity. In one embodiment, if the subnet manager does not receive a response from the SMA to the data packet including the current version of the authentication data, it sends another data packet with a previous version of the authentication data.

Similarly to other components of the switch 200, the management port 208 is not completely functional until it is loaded with some initial data. This initial data includes, for example, authentication data such as a management key, a GUID of the switch, a GUID of the port, a LID of the switch, etc.

In addition to the communications means 214 and hub 206 that provide exchange of data between the ports 204, 208 and 212 and arbiter 210, the switch 200 includes an internal bus 202, which enables internal communication between the components of the switch 200. In one embodiment, the internal bus 202 is a proprietary bus of Red- Switch™ that is referred to as Internal Access Loop (IAL). Alternatively, any other point-to-point communications means known in the art can be used to provide internal exchange of data within the switch 200.

In one embodiment, the management port 208 also includes an interface controller 226, which communicates with one or more non-volatile storage devices 230 that store authentication and configuration information associated with the switch 200. In another embodiment, the interface controller 226 resides on a different component of the switch 200 (e.g., on one of eight communications port 204, arbiter 210, or functional port 212). In yet another embodiment, the interface controller 226 is an independent component of the switch 200. The interface controller 226 may be implemented in hardware, software, or a combination of both. The interface controller 226 communicates with the non-volatile storage device 230 via a bus 228. The interface controller 226 is responsible for retrieving authentication and configuration information from the non-volatile storage device 230 during the initialization process for distribution to various components of the switch 200. In one embodiment, prior to retrieving any portion of authentication and configuration information, the interface controller 226 determines whether this information could have been contaminated, as will be discussed in more detail below.

In addition, the interface controller 226 is responsible for managing updates to authentication and configuration information stored on the non-volatile storage device 230. An update may be requested by the subnet manager (e.g., via a SMP). In one embodiment, when performing an update, the interface controller 226 uses an update protocol that facilitates detection of data contamination within the non-volatile storage device 230, as will be described in greater detail below.

Figure 3:
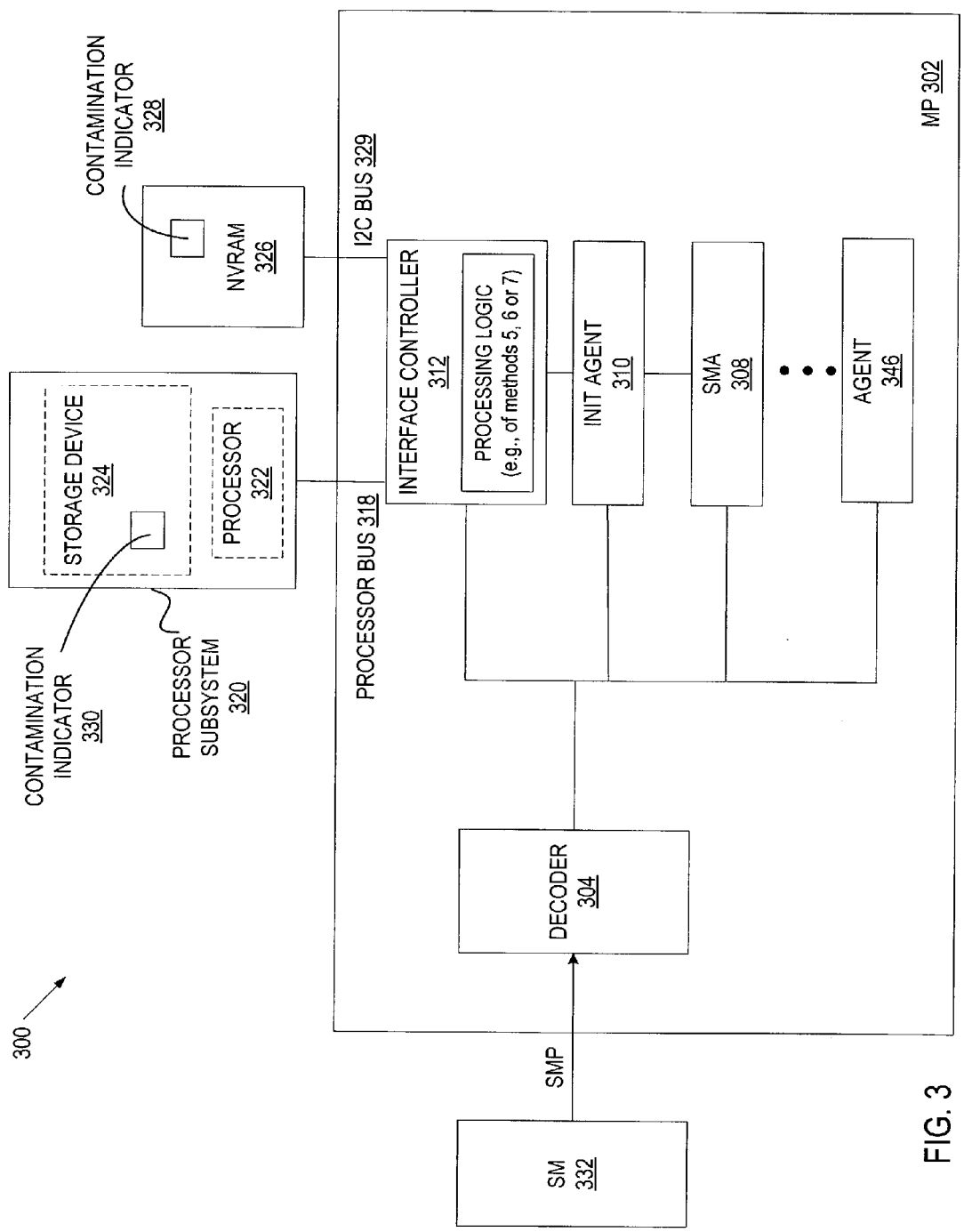
FIG. 3 is a block diagram of a system for facilitating detection of data contamination within a non-volatile storage device coupled to an interconnect device, according to one embodiment of the present invention.

FIG. 3 is a block diagram of a system 300 for facilitating detection of data contamination within a non-volatile storage device coupled to an interconnect device, according to one embodiment of the present invention.

Referring to FIG. 3, a management port 302 of an interconnect device includes a set of agents that perform various functions. One of the agents is an interface controller 312. The interface controller 312 is coupled to one or more non-volatile storage devices that store authentication and configuration information associated with the interconnect device. Each non-volatile storage device may be a flash memory, a non-volatile random access memory (NVRAM), a hard drive, etc. The interface controller 312 is responsible for retrieving requested information from the non-volatile storage device(s) and submitting update requests to the non-volatile storage device(s).

Another agent residing in the management port 302 is an initialization agent 310 that is responsible for controlling the initialization of the interconnect device. Specifically, when a reset of the interconnect device occurs, the initialization agent 310 queries the interface controller 312 for configuration and authentication data stored in the non-volatile storage device(s) and then distributes this data to the units of the interconnect device.

Yet other agents residing in management port 302 include a decoder 304 and a subnet management agent (SMA) 308. The decoder 304 is responsible for decoding and dispatching data packets received at the management port 302 to destination agents within the management port 302. The decoder 304 includes a copy of the management key and associated attributes that are loaded into the decoder 304 during the initialization using the authentication data stored in the non-volatile storage device. When the decoder 304 determines that a data packet being decoded is a subnet management packet (SMP), the decoder 304 determines whether the SMP was sent by an authorized entity using the management key and the attributes. If the determination is negative, the decoder 304 discards the SMP.

The SMA 308 is a targeting destination agent for subnet management packets (SMPs) sent by a subnet manager 332. If the SMA 308 receives an SMP requesting an update of data residing on the non-volatile storage device, the SMA 308 forwards this request to the interface controller 328, which then triggers the update.

In one embodiment, the non-volatile storage device storing the configuration and authentication information pertaining to the interconnect device is an independent non-volatile random access memory (NVRAM) 326 coupled to the interface controller 312 via a bus 329 (e.g., an Inter-IC (I2C) bus). The NVRAM 326 includes a contamination indicator 328 that facilitates detection of data contamination in the NVRAM 326. When receiving a request to write configuration and/or authentication data to the NVRAM 326, the interface controller 312 updates the contamination indicator 328 with a value indicating potential data contamination and then transmits configuration and/or authentication data to the NVRAM 326 for a write. The data to be written to the NVRAM 326 may be longer than the width of the I2C bus 329, thus requiring multiple cycles to accomplish the write of the entire data. Hence, there is a possibility of data contamination in the NVRAM 326 (e.g., if the interconnect device goes down after the first cycle ends but before the last cycle ends). If the entire write operation completes successfully, the interface controller 312 updates the contamination indicator 330 with a value indicating that the data in the NVRAM 326 is not contaminated. Subsequently, when the interface controller 312 is requested to retrieve configuration and/or authentication data from the NVRAM 326, the interface controller 312 will determine that the data in the NVRAM 326 is not contaminated based on the contamination indicator 330 and retrieve the requested data from the NVRAM 326. In one embodiment, the NVRAM 326 also includes a pre-write area facilitating recovery from data contamination in the NVRAM 326, as will be discussed in more detail below.

In another embodiment, the configuration and authentication information pertaining to the interconnect device is stored in both the NVRAM 326 and a non-volatile storage device 324 within a processor subsystem 320 coupled to the interface controller 312. In the processor subsystem 320, access to data stored on non-volatile storage device 316 may be controlled by a software driver running on a processor 322. The interface controller 312 sends read and write requests pertaining to data stored on the storage device 324 to the processor subsystem 320 via a processor bus 318, and the software driver controls the execution of these read and write requests. Similarly to the NVRAM 326, the storage device 324 includes a contamination indicator 330 to facilitate detection of data contamination in the storage device 324. The interface controller 312 knows in which device the configuration and authentication information resides and requests this information or its portions from the appropriate storage device when needed. Similarly, when an update of some portions of this information is required, the interface controller 312 sends an update request to the appropriate storage device.

In yet another embodiment, the configuration and authentication information resides entirely on the storage device 324 within the processor subsystem 320.

Figure 4:
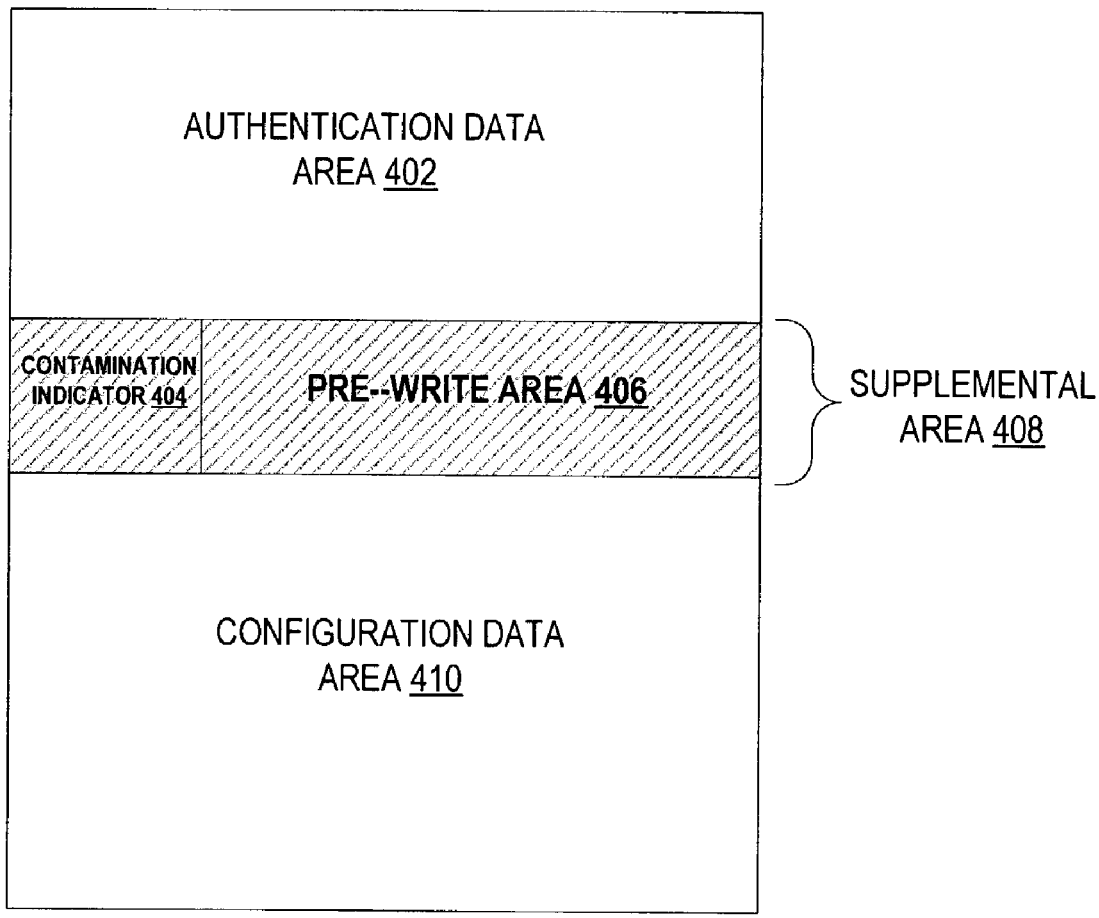
FIG. 4 illustrates a memory structure of a non-volatile data storage device, according to one embodiment of the present invention.

FIG. 4 illustrates a memory structure of a non-volatile data storage device 400 such as the storage device 324 or the NVRAM 326, according to one embodiment of the present invention.

Referring to FIG. 4, the non-volatile storage device 400 includes an authentication data area 402, a supplemental area 408 and a configuration data area 410. The authentication data area 402 and the configuration data area 410 are collectively referred to herein as a content area. The authentication data area 402 stores authentication information such as a management key and associated attributes, a GUID of the interconnect device, a GUID of the port, a LID of the interconnect device, etc. The configuration data area 410 stores parameters pertaining to port links, virtual lane parameters for each port, a set of tables such as a Linear Forwarding Table, a Multicast Forwarding Table, a SL to VL Mapping Table, etc.

The supplemental area 408 includes a contamination indicator 404 that is used to detect data contamination in the content area. In one embodiment, the supplemental area 408 also includes a pre-write area 406 that is used to recover from data contamination in the content area. Specifically, data requested to be written to the content area is first written to the pre-write area 406. Once the write to the pre-write area 406 is completed, the contamination indicator 404 is set to a contamination value, and a request to write the data to the content area is issued. If the write to the content area completes successfully, the contamination indicator 404 is updated with a no-contamination value. Alternatively, if, for example, the interconnect device goes down before the write to the content area has completed, data in the content area may become contaminated, as will be indicated by the current value of the contamination indicator 404. Subsequently, during the initialization of the interconnect device, the interface controller will detect contamination in the content area based on the current value of the contamination indicator 404 and will use the pre-write area storing the data requested to be written to the content area to recover from data contamination. In particular, the interface controller will read data currently stored in the pre-write area 406, write this data to the content area, and then retrieve the authentication and configuration data from the content area for distribution to the units of the interconnect device.

Figure 5:
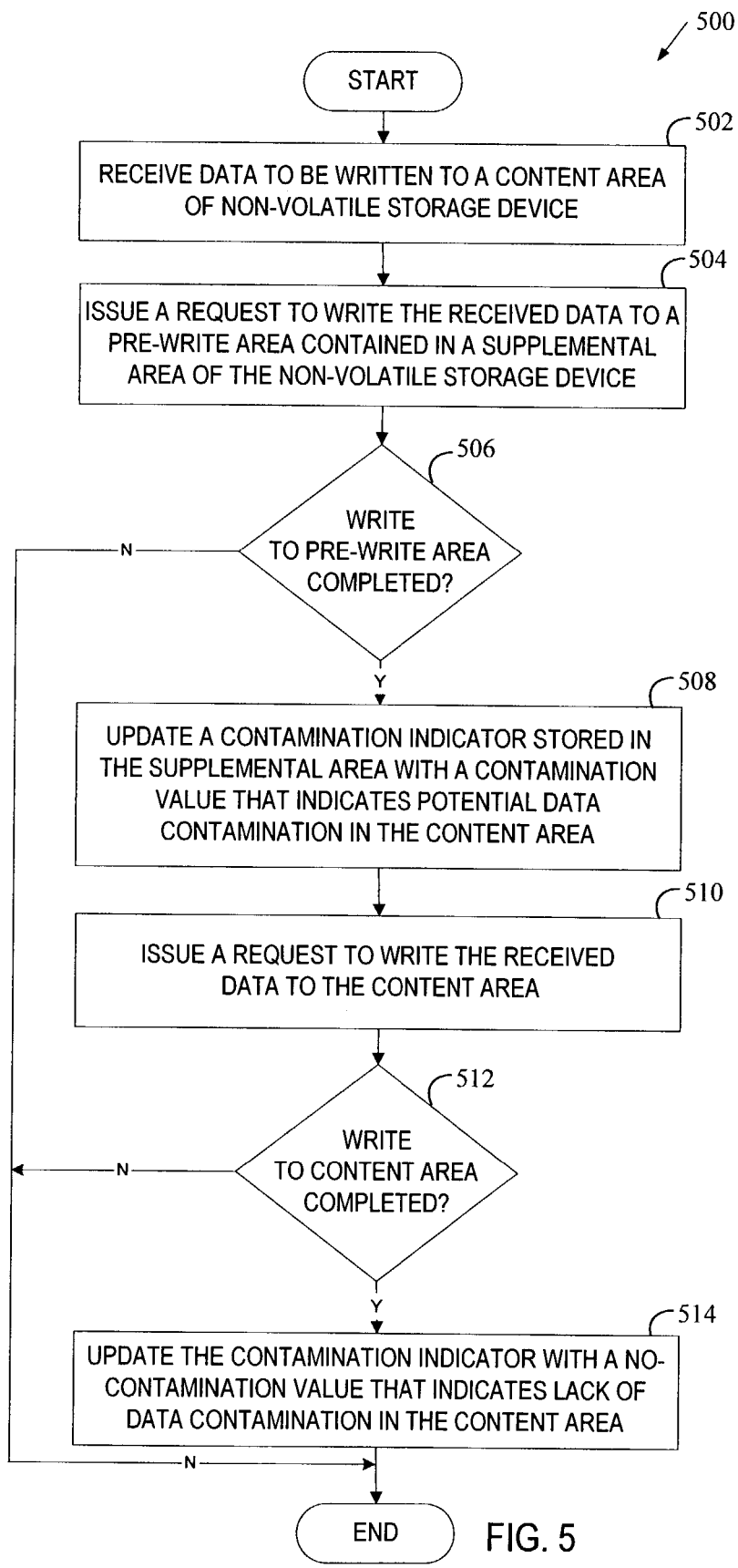
FIG. 5 is a flow diagram of a method for facilitating detection of, and recovery from, data contamination in a non-volatile storage device coupled to an interconnect device.

FIG. 5 is a flow diagram of a method 500, according to an exemplary embodiment of the present invention, for facilitating detection of, and recovery from, data contamination in a non-volatile storage device coupled to an interconnect device. Method 500 is performed by processing logic, which may comprise hardware, software, or a combination of both. Processing logic of method 500 is implemented in a management port of the interconnect device (e.g., in the interface controller 312 of FIG. 3).

Method 500 begins with processing logic receiving data to be written to a content area of the non-volatile storage device (processing block 502). As discussed above, the non-volatile storage device includes a content area that stores authentication and configuration data associated with the interconnect device and a supplemental area that stores information facilitating detection of, and recovery from, data contamination in the content area.

Next, in one embodiment, processing logic issues a request to write the received data to a pre-write area that is contained in the supplemental area of the non-volatile storage device (processing block 504). In one embodiment, this request is a memory-write command. Alternatively, the request may be in any other form understandable by the non-volatile storage device or software driver controlling access to the non-volatile storage device.

At decision box 506, processing logic determines whether the write of data to the pre-write area has completed. As discussed above, the size of the write data may be larger than the width of the bus connecting the interconnect device and the non-volatile storage device, thus requiring more than one cycle for completing the write. Hence, there is a chance for data contamination (e.g., if the interconnect device goes down after the first cycle ends but before the last cycle ends).

If the write to the pre-write area does not complete, method 500 ends. The incomplete write could result in contamination of data in the pre-write area.

Alternatively, if processing logic determines that the write to the pre-write area has completed successfully (e.g., based on a notification received from the non-volatile storage device), processing logic updates a contamination indicator stored in the supplemental area with a contamination value that indicates potential data contamination in the content area (processing block 508) and issues a request to write the received data to the content area (processing block 510). Further, processing logic determines whether the write to the content area has completed (decision box 512). If the write to the content-area does not complete, method 500 ends. If processing logic determines that the write has completed successfully, it updates the contamination indicator with a no-contamination value that indicates lack of data contamination in the content area (processing block 514).

Method 500 represents one embodiment of a protocol for updating data stored in a non-volatile storage device. This update protocol can result in the following combinations of data stored in the non-volatile storage device:

TABLE 1

| Contamination indicator | Pre-write area | Content area |
| --- | --- | --- |
| Contamination value | Not contaminated; current version | May be contaminated |
| No-contamination value | May be contaminated | Not contaminated; current or previous version |

As illustrated in Table 1, if the contamination indicator is set to a contamination value, it means that the content area may store contaminated data but the pre-write area stores non-contaminated, current information. Alternatively, if the contamination indicator is set to a non-contamination value, it means that the content area stores non-contaminated data that may represent a current version of the authentication and configuration information (if the last write to the content area has completed successfully) or a previous version of the authentication and configuration information (if the last write to the pre-write area has not yet begun).

Figure 6:
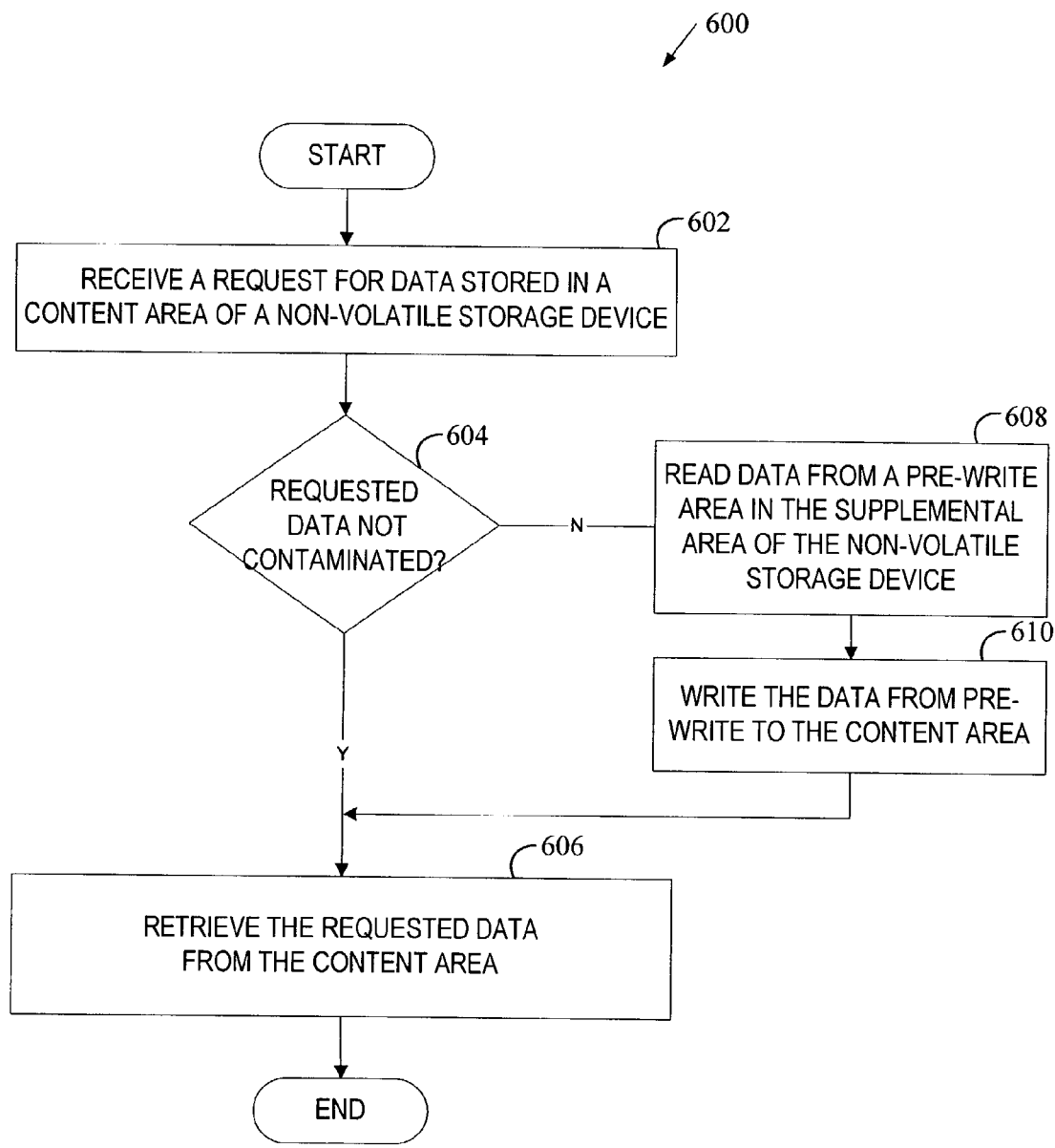
FIG. 6 is a flow diagram of a method for detecting data contamination in a non-volatile storage device coupled to an interconnect device, according to one embodiment of the present invention.

FIG. 6 is a flow diagram of a method 600 for detecting data contamination in a non-volatile storage device coupled to an interconnect device, according to one embodiment of the present invention. Method 600 is performed by processing logic, which may comprise hardware, software, or a combination of both. Processing logic of method 600 is implemented in a management port of the interconnect device (e.g., in the interface controller 312 of FIG. 3).

Method 600 begins with processing logic receiving a request for data stored in a content area of the non-volatile storage device (processing block 602). In one embodiment, the request is received during the initialization of the interconnect device and is asking for authentication and configuration data stored in the content area.

Next, processing logic determines whether the requested data is not contaminated based on a current value of a contamination indicator stored in a supplemental area of the non-volatile storage device (decision box 604). If the determination is positive, processing logic retrieves the requested data from the content area (processing block 606). The retrieved data may then be distributed to the units of the interconnect device. As illustrated in Table 1, the retrieved data may represent a current version of the authentication and/or configuration data or a previous version of the authentication and/or configuration data. As discussed above, in one embodiment, a subnet manager maintains two most recent versions of the authentication data for the interconnect device. Accordingly, the loading of the previous version of the authentication data will not prevent communication between the subnet manager and the SMA in the interconnect device. Specifically, the subnet manager will first send a data packet with the current version of the authentication data and then with a previous version of the authentication data if no response to the first data packet is received. If the subnet manager receives a response to the second data packet, it will request to update the authentication and configuration data residing in the non-volatile storage device and the units of the interconnect device with the current version of the authentication and configuration data.

Otherwise, if the determination made in decision box 604 is negative (i.e., the requested data is likely to be contaminated), processing logic reads data from a pre-write area in the supplemental area of the non-volatile storage device (processing block 608), writes this data to the content area (processing block 610), and then retrieves the requested data from the content area (processing block 606).

In one embodiment, the supplemental area of the non-volatile storage device includes more than one combination of a contamination indicator and a pre-write area. That is, the supplemental area includes multiple update control regions, with each update control region containing a contamination indicator and a pre-write area. Multiple update control regions are maintained to address the write endurance limitation of the non-volatile storage device. Specifically, a threshold is established to limit a number of writes to each update control region. Once the number of writes exceeds a predefined threshold, a currently active update control region becomes inactive, and a next update control region is selected as active. An active update control region pointer is maintained in the supplemental area to identify the currently active update control region.

Figure 7:
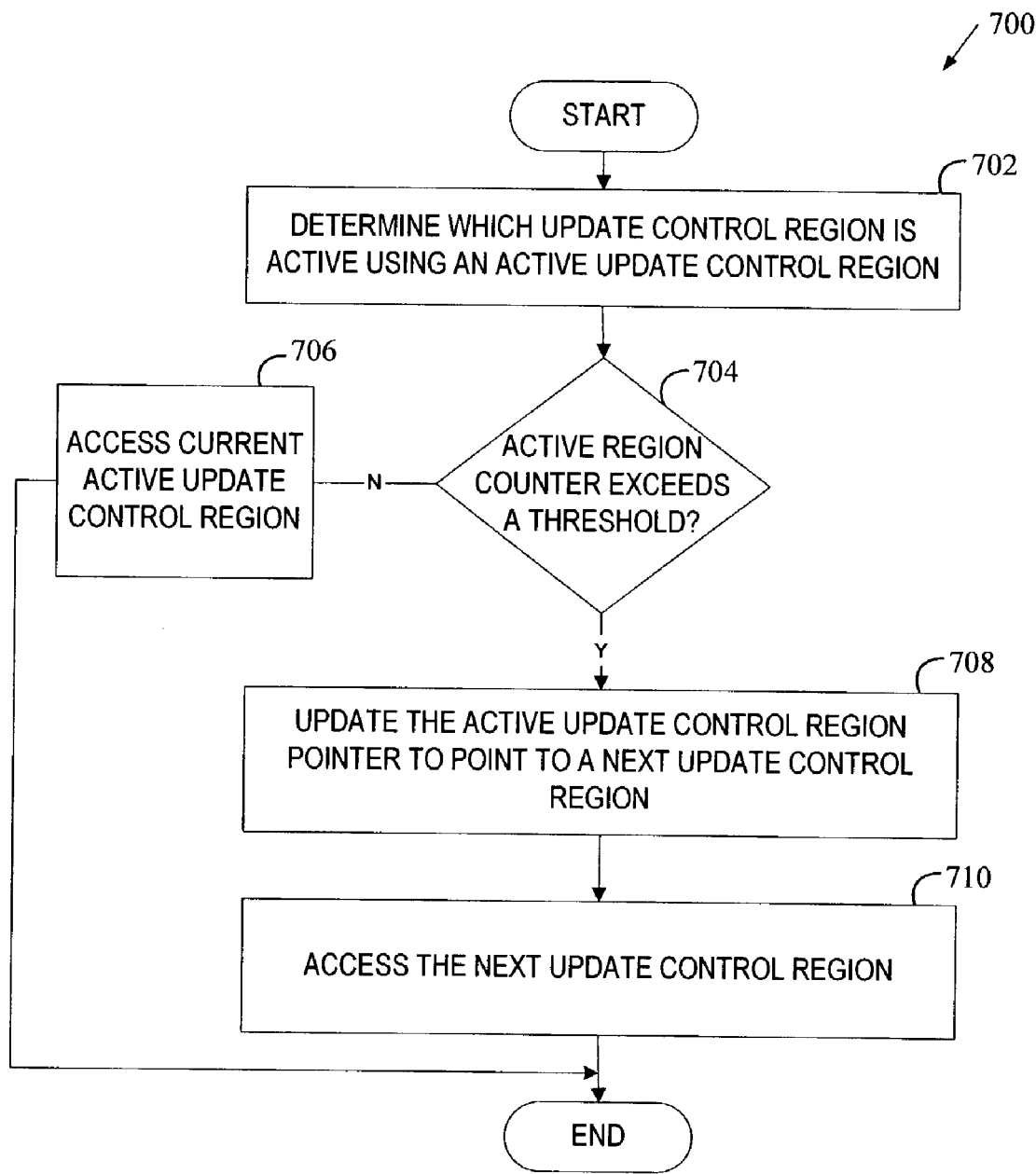
FIG. 7 is a flow diagram of a method 700 for accessing an active update control region in a non-volatile storage device when receiving a request to write data to the non-volatile storage device, according to one embodiment of the present invention.

FIG. 7 is a flow diagram of a method 700 for accessing an active update control region in a non-volatile storage device when receiving a request to write data to the non-volatile storage device, according to one embodiment of the present invention. Method 700 is performed by processing logic, which may comprise hardware, software, or a combination of both. Processing logic of method 700 is implemented in a management port of the interconnect device (e.g., in the interface controller 312 of FIG. 3).

Method 700 begins with processing logic determining which update control region is active using an active region pointer (processing block 702). Next, processing logic determines whether a counter associated with the currently active update control region exceeds a predefined threshold (decision box 704). If the determination is negative, then processing logic decides that data can still be written to the currently active update control region and issues a request to write data to this region's pre-write area (processing block 706). If the determination is positive, then processing logic decides that the currently active update control region can no longer be updated due to the write endurance limitation and updates the active region counter to point to a next update control region (processing block 708). Processing logic then issues a request to write data to a pre-write area of the next update control region (processing block 710).

Thus, methods and systems to facilitate detection of, and recovery from, data contamination in a non-volatile storage device have been described. Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

What is claimed is:

1. A method comprising:
   receiving data to be written to a content area in a non-volatile storage device;
   updating a contamination indicator stored in a supplemental area of the non-volatile storage device with a first value indicating potential data contamination in the content area;
   transferring the data to the non-volatile storage device for a write to the content area; and
   updating the contamination indicator with a second value indicating lack of data contamination in the content area if determining that the write of the transferred data has completed.

2. The method of claim 1 wherein the non-volatile storage device is a non-volatile random access memory (NVRAM).

3. The method of claim 1 wherein the content area stores at least one of authentication data pertaining to an interconnect device coupled to the non-volatile storage device and configuration information pertaining to the interconnect device.

4. The method of claim 1 further comprising:
   prior to setting the contamination indicator to the first value, issuing a request to write the received data to a pre-write area in the supplemental area in the non-volatile storage device and determining that the write to the pre-write area has completed.

5. The method of claim 4 wherein the pre-write area and the contamination indicator are part of an active update control region within the supplemental area, the active update control region being one of a plurality of update control regions within the supplemental area.

6. The method of claim 5 further comprising:
   determining which one of the plurality of update control regions is the active update control region using an active update control region pointer.

7. The method of claim 6 further comprising:
   determining that an update counter associated with the active update control region exceeds a predefined threshold; and
   updating the active update control region pointer to point to a next update control region.

8. The method of claim 1 wherein:
   a size of the data is larger than a width of a bus connecting the non-volatile storage device and an interconnect device; and
   the data is transferred to the interconnect device for the write to the content area in two or more cycles.

9. The method of claim 1 further comprising:
receiving a request for data stored in the content area; and
determining whether the requested data is likely to be contaminated based on a current value of the contamination indicator.

10. A method comprising:
receiving a request for data stored in a content area of a non-volatile storage device;
determining whether the requested data is contaminated based on a current value of a contamination indicator stored in a supplemental area of the non-volatile storage device; and
retrieving the requested data from the content area if the requested data is not contaminated.

11. The method of claim 10 wherein the non-volatile storage device is a non-volatile random access memory (NVRAM).

12. The method of claim 10 wherein the content area stores at least one of authentication data pertaining to the interconnect device and configuration information pertaining to the interconnect device.

13. The method of claim 10 wherein the request for the requested data is received during initialization of the interconnect device.

14. The method of claim 10 further comprising:
determining that the requested data is likely to be contaminated;
reading data from a pre-write area in the supplemental area of the non-volatile storage device;
writing the read data to the content area of the non-volatile storage device; and
retrieving the requested data from the content area of the non-volatile storage device.

15. The method of claim 14 wherein the pre-write area and the contamination indicator are part of an active update control region within the supplemental area of the non-volatile storage device, the active update control region being one of a plurality of update control regions within the supplemental area.

16. The method of claim 15 further comprising:
determining which one of the plurality of update control regions is the active update control region using an active update control region pointer.

17. A system comprising:
a non-volatile storage device including a content area to store data associated with an interconnect device and a supplemental area to store a contamination indicator specifying whether the data in the content area is likely to be contaminated; and
a port of the interconnect device, coupled to the non-volatile storage device via a bus, the port including an interface controller to receive data to be written to the content area, to update the contamination indicator with a first value indicating potential data contamination in the content area, to transfer the data to the non-volatile storage device for a write to the content area, and to update the contamination indicator with a second value indicating lack of data contamination in the content area if determining that the write to the content area has completed.

18. The system of claim 17 wherein:
a size of the data to be written to the content area is larger than a width of the bus; and
the data is transferred to the non-volatile storage device for the write to the content area in two or more cycles.

19. The system of claim 17 wherein the port is a management port.

20. The system of claim 19 wherein:
the non-volatile storage device is a non-volatile random access memory (NVRAM); and
the bus is an Inter-IC (I2C) bus.

21. The system of claim 19 wherein:
the non-volatile storage device is part of a processor subsystem; and
the bus is a processor bus.

22. The system of claim 17 wherein the content area stores at least one of authentication data pertaining to the interconnect device and configuration information pertaining to the interconnect device.

23. The system of claim 17 wherein the supplemental area comprises an active update control region containing the contamination indicator and a pre-write area.

24. The system of claim 23 wherein the interface controller is to update the contamination indicator with the first value after requesting a write of the data to the pre-write area and determining that the write to the pre-write area has completed.

25. The system of claim 23 wherein the supplemental area further includes one or more inactive update control regions and a pointer to the active update control region.

26. The system of claim 25 wherein the interface controller is to determine which one of a plurality of update control regions is the active update control region using the active update control region pointer.

27. The system of claim 26 wherein the interface controller is to designate a new active update control region upon determining that an update counter associated with the current active update control region exceeds a predefined threshold, and to update the active update control region pointer to point to the new active update control region.

28. The system of claim 17 wherein the interface controller is further to receive a request for data stored in the content area, and to determine whether the requested data is likely to be contaminated based on a current value of the contamination indicator.

29. A system comprising:
a non-volatile storage device including a content area to store data associated with an interconnect device and a supplemental area to store a contamination indicator specifying whether the data in the content area is likely to be contaminated; and
a port of the interconnect device, coupled to the non-volatile storage device via a bus, the port including an interface controller to receive a request for data stored in the content area, to determine whether the requested data is contaminated based on a current value of the contamination indicator, and to retrieve the requested data from the content area if the requested data is not contaminated.

30. The apparatus of claim 29 wherein the non-volatile storage device is a non-volatile random access memory (NVRAM).

31. The apparatus of claim 29 wherein the content area stores at least one of authentication data pertaining to the interconnect device and configuration information pertaining to the interconnect device.

32. The apparatus of claim 29 wherein the request for the data is received during initialization of the interconnect device.

33. The apparatus of claim 29 wherein the interface controller is further to determine that the requested data is likely to be contaminated, to read data from a pre-write area in the supplemental area of the non-volatile storage device, to write the read data to the content area, and to retrieve the requested data from the content area.

34. The apparatus of claim 33 wherein the pre-write area and the contamination indicator are part of an active update control region within the supplemental area, the active update control region being one of a plurality of update control regions within the supplemental area.

35. The apparatus of claim 34 wherein the interface controller is further to determine which one of the plurality of update control regions is the active update control region using an active update control region pointer.

36. A system comprising:
   means for receiving data to be written to a content area in a non-volatile storage device;
   means for updating a contamination indicator stored in a supplemental area of the non-volatile storage device with a first value indicating potential data contamination in the content area;
   means for transferring the data to the non-volatile storage device for a write to the content area; and
   means for updating the contamination indicator with a second value indicating lack of data contamination in the content area if determining that the write of the transferred data has completed.

37. A system comprising:
   means for receiving a request for data stored in a content area of a non-volatile storage device;
   means for determining whether the requested data is contaminated based on a current value of a contamination indicator stored in a supplemental area of the non-volatile storage device; and
   means for retrieving the requested data from the content area if the requested data is not contaminated.

38. A machine-readable medium storing a description of a circuit, said circuit comprising:
   a sub-network management agent (SMA) to request an update pertaining to a non-volatile storage device including a content area to store data associated with an interconnect device and a supplemental area to store a contamination indicator specifying whether the data in the content area is likely to be contaminated; and
   an interface controller, coupled to the SMA, to receive data to be written to the content area from the SMA, to update the contamination indicator with a first value indicating potential data contamination in the content area, to transfer the data to the non-volatile storage device for a write to the content area, and to update the contamination indicator with a second value indicating lack of data contamination in the content area if determining that the write to the content area has completed.

39. A machine-readable medium storing a description of a circuit, said circuit comprising:
   an initialization agent to issue a request for data stored in a content area of a non-volatile storage device that also includes a supplemental area to store a contamination indicator specifying whether the data in the content area is likely to be contaminated; and
   an interface controller, coupled to the initialization agent, to receive the request from the initialization agent, to determine whether the requested data is contaminated based on a current value of the contamination indicator, and to retrieve the requested data from the content area if the requested data is not contaminated.

* * * * *